(12) United States Patent
Nagendran et al.

(10) Patent No.: US 12,333,415 B2
(45) Date of Patent: Jun. 17, 2025

(54) NEURAL NETWORK ACCELERATORS

(71) Applicant: Hewlett Packard Enterprise Development LP, Houston, TX (US)

(72) Inventors: Vaithyalingam Nagendran, Karnataka (IN); Jitendra Onkar Kolhe, Karnataka (IN); Soumitra Chatterjee, Karnataka (IN); Shounak Bandopadhyay, Karnataka (IN)

(73) Assignee: Hewlett Packard Enterprise Development LP, Spring, TX (US)

( * ) Notice: Subject to any disclaimer, the term of this patent is extended or adjusted under 35 U.S.C. 154(b) by 1106 days.

(21) Appl. No.: 17/225,580

(22) Filed: Apr. 8, 2021

(65) Prior Publication Data
US 2022/0012573 A1    Jan. 13, 2022

(30) Foreign Application Priority Data
Jul. 10, 2020 (IN) .............................. 202041029463

(51) Int. Cl.
*G06F 15/80*   (2006.01)
*G06F 9/50*    (2006.01)
*G06N 3/063*   (2023.01)

(52) U.S. Cl.
CPC ........... *G06N 3/063* (2013.01); *G06F 9/5027* (2013.01); *G06F 9/5061* (2013.01); *G06F 15/80* (2013.01)

(58) Field of Classification Search
None
See application file for complete search history.

(56) References Cited

U.S. PATENT DOCUMENTS

| 9,811,775 | B2 | 11/2017 | Krizhevsky et al. |
| 10,127,494 | B1 | 11/2018 | Cantin et al. |
| 10,541,026 | B2 | 1/2020 | Yang et al. |
| 2019/0235871 | A1 | 8/2019 | Chen et al. |
| 2021/0191765 | A1* | 6/2021 | Bokam .................... G06F 30/20 |
| 2022/0092386 | A1* | 3/2022 | Zhou ....................... G06N 3/045 |

OTHER PUBLICATIONS

Ankit et al., "PUMA: A Programmable Ultra-efficient Memristor-based Accelerator for Machine Learning Inference", ACM, Apr. 13-17, 2019, 17 pages.
Chen et al., "Survey of Accelerator Architectures for Deep Neural Networks", Research Artificial Intelligence-Review, 2020, pp. 1-11.
Diaz et al., "Towards a standard-based domain-specific platform to solve machine learning-based problems", International Journal of Artificial Intelligence and Interactive Multimedia, vol. 3, N°5, 2015, pp. 06-12.
Medium, "How to Train a Very Large and Deep Model on One GPU?", available online at <https://medium.com/syncedreview/how-to-train-a-very-large-and-deep-model-on-one-gpu-7b7edfe2d072>, Apr. 29, 2017, 8 pages.

* cited by examiner

*Primary Examiner* — Craig C Dorais
(74) *Attorney, Agent, or Firm* — Hewlett Packard Enterprise Patent Department

(57) ABSTRACT

Examples of performing tensor operations by a neural network-based computing system, are described. In an example, a first output working set generated by a first operation, wherein the first output working set is a set of processed partitioned tensors, is obtained. The first output working set is then copied to the output working set, for retrieving by the second operation.

20 Claims, 6 Drawing Sheets

NEURAL NETWORK ACCELERATORS

BACKGROUND

Neural network-based computing systems enable complex tasks, which include comprehension, language translation, image recognition; or speech recognition. These systems, also referred to as neural network accelerators, may perform complex computations, such as matrix-vector multiplication. Such a system operates upon, and generates data in the form of tensors. A tensor may be considered as an N-dimensional data structure. For example, a matrix represented by a set of rows and columns, is an example of 2-dimensional tensor.

BRIEF DESCRIPTION OF FIGURES

Systems and/or methods, in accordance with examples of the present subject matter are now described, by way of example, and with reference to the accompanying figures, in which.

DETAILED DESCRIPTION

Figure 1:
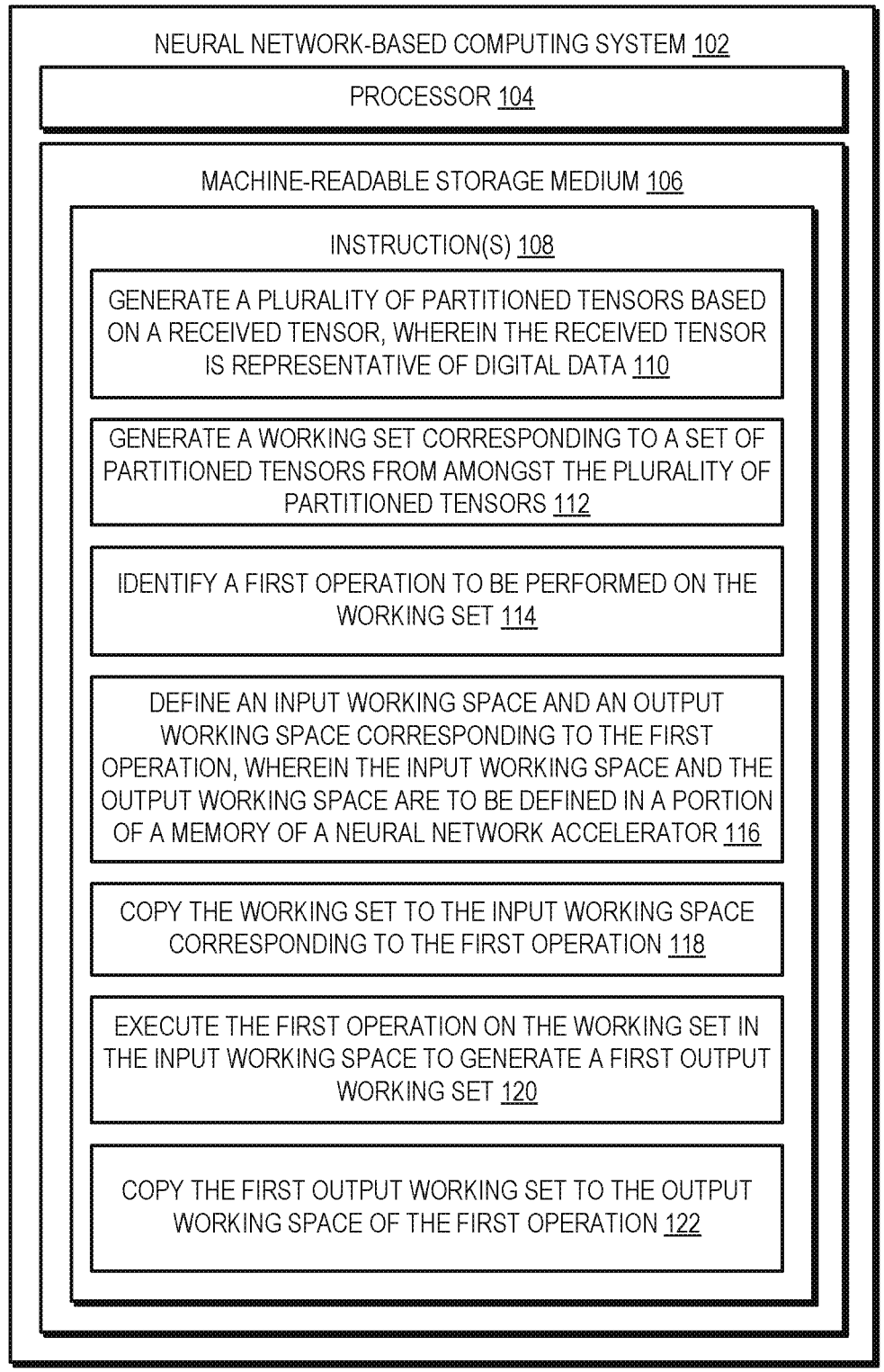
FIG. 1 illustrates a neural network-based computing system for performing tensor operations, as per an example.

Neural network-based computing systems include a neural network accelerator. A neural network accelerator may be a hardware for performing neural network or artificial intelligence related operations. Such operations may be implemented in multiple layers, with each layer capable of identifying higher level features of a corresponding input. For example, in the context of image processing, initial layers or operations may identify edges, curves, etc., while the later layers may identify recognizable features of what an image may represent. In implementing such operations, the neural network accelerator is utilized for performing complex computational tasks. Such tasks may be carried out on data which is in the form of tensors. Tensors may be used to represent digital data, such as images, or sound recordings. Example of such computations include, but is not limited to, matrix-vector multiplication.

An example of a neural network-based computing systems is the Dot-Product Engine (DPE). DPE based systems include computing cores which comprise memristive crossbar arrays. The cores may be used to perform matrix-vector or dot product computations. Operating of such memristive-based systems involve providing an input voltage signal for each row of the crossbar which is weighted by the conductance of the resistive elements that may be present in each column. This produces a current output for each column. Although the input and output obtained is analog, the same may be digitized using analog-to-digital convertors. Such memristive-based systems are characterized by high efficiency and accuracy in terms of performing complex computation tasks, such as a matrix-vector multiplication.

The memristive crossbar-based architecture maintains a hierarchy of computational nodes. For example, a combination of memristive crossbar arrays form a core. Multiple such cores form a tile unit, with a group of tile units forming a clump unit. It may be noted that the present terms are utilized in the context of DPE-based architecture. In other systems which utilize memristive crossbar arrays, the computational hierarchy may be represented through different terminology, without deviating from the underlying concept. Returning to the DPE architecture, each type of compute nodes, i.e., the core, tile unit and the clump unit may further include a corresponding memory. The size of the memory varies across the hierarchical compute nodes. For example, the size of the memory of the tile unit will be greater than the size of the memory of the core.

The neural network-based computing systems operate on data which may range in the order of megabytes (MB) in the form of tensors. A tensor, in the context of neural network-based computing systems, may refer to a data construct having N-dimensions. In case of an image being used in neural network-based computing systems, such an image may be represented as a 3-dimensional tensor (having X*Y pixels and a certain number of channel). For memristive array-based systems, which although are capable of being used for neural network-based computation, the size of tensors (which is in the order of MBs) may be large for them to be handled by tile units or cores (which have memory of the order of KB) of a neural network accelerator. To enable the processing of tensors on the DPE-based systems, during compilation the tensor may be partitioned into partitioned tensors. The computational operations may then be implemented to operate on the partitioned tensors, with each operation providing an output tensor directly to the next operation, which then may operate to provide its corresponding output. The results of the tensor operations using the partitioned tensors may then be suitably combined to provide the result of the tensor operation.

Although the present approaches permit executing tensor operations through partitioned tensors, performing operations partitioned tensors increases the compile time required for generating a machine-executable code, which may be executed on a neural network accelerator. For instance, a current operation may be dependent on an output of another prior operation that is to operate onto a partitioned tensor. As may be understood, the current operation will have to wait till the prior operation provides the output for the current operation to resume. Such approaches may therefore introduce stalls in the tensor operations, in which the subsequent operations may have to wait for the prior operations to complete, before the subsequent operations may be initiated.

The tensor operations pertaining to the different partitioned tensors may be abstracted onto a compute graph. The compute graph, amongst other things, may specify the operation (e.g., pertaining to each partitioned tensor) that is to be performed as part of the entire tensor operation. Such compute graphs may themselves become large owing to the multiple number of operations handling the plurality of partitioned tensors that have to be prescribed in the compute graph. This further adds to the compile time and computational load on the compute nodes, i.e., tile units or the cores. Furthermore, owing to the size and complexity of the compute graph inhibits implementation of any optimization functions to increase the efficiency of the entire tensor operation.

Approaches for implementing tensor operations in neural network-based computing systems are described herein. In an example, a set of partitioned tensors are selected and defined as a working set. With the working set available, an appropriate storage is allocated in the memory for the working set under consideration. With the working set identified, operations which would be operating on input working sets (i.e., which will act as inputs to an operation) and the output working sets (i.e., which will be generated as output to an operation) may be determined. In an example, the operations may be defined through a compute graph.

Once the operations are identified, a corresponding memory portion, referred to as working space, within a tile memory of the neural network-based computing systems may be allocated. In an example, the size of the working space may be defined based on a minimum number of working sets that are to be processed for performing a stage of the tensor operation. As may be understood, multiple such sub-operations may then be linked together to implement the functionality of a neural network application.

The operations, when executed, produces an output working set. The present example is described from the perspective of a first operation and a second operation. The first operation and the second operations are matrix-vector multiplication (MVM) operations. It may be noted that any reference to a first or a second operation refers to such respective MVM operations. Although the present example is described in the context of the first operation and the second operations, the present subject matter may involve other MVM operations (referred to as operations) without deviating from the scope of the present subject matter. Both the first operation and the second operation are provided with respective input working space and an output working space. The first operation when performed on an input working set may generate a first output working set (referred to as a first output) which is placed in the output working space of the first operation. Thereafter, the second operation retrieves the first output and places the first output in the input working space of the second operation. The second operation may then operate on the first output (available in the second input working space) to generate a second output working set (referred to as the second output), The second output, once generated, may be placed onto a portion of the output working space which corresponds to the second operation. In this manner, the output working sets for any given operation may be provided to the subsequent contiguously linked operation.

In an example, a buffer memory may also be allocated for an input tensor and for an output tensor based on the entire size of the tensor and not only based on the size of the working set. In another example, each of the different operations may be synchronized with respect to each other. The synchronization ensures that the rate at which the working sets are being copied into the output working sets are matched with the rate at which the working sets are being copied by another operation.

As mentioned previously, the present subject matter ensures that each operation does not remain idle and continuously obtains an appropriate working set and performs the operation. As mentioned previously, the different operations which are to process the different working sets are linked with each other.

The present subject matter prevents occurrences of stall during the tensor operations. Furthermore, tensors with higher dimensions may also be processing using the present approaches. In addition, the linked operations improve utilization of compute nodes (e.g., the cores, etc.) thereby reducing idle wait cycles.

The above examples are further described in conjunction with appended figures. It may be noted that the description and figures merely illustrate the principles of the present subject matter. It will thus be appreciated that various arrangements that embody the principles of the present subject matter, although not explicitly described or shown herein, may be devised from the description, and are included within its scope. Moreover, all statements herein reciting principles, aspects, and examples of the present subject matter, as well as specific examples thereof, are intended to encompass equivalents thereof. In the figures, the left-most digit(s) of a reference number identifies the figure in which the reference number first appears. The same numbers are used throughout the figures to reference like features and components.

FIG. 1 illustrates an example neural network-based computing system 102 (referred to as system 102) for performing tensor operations, in accordance with an example of the present subject matter. The system 102 includes a processor 104, and a machine-readable storage medium 106 which is coupled to, and accessible by, the processor 104. The system 102 may be implemented in any computing system, such as a storage array, server, desktop or a laptop computing device, a distributed computing system, or the like. Although not depicted, the system 102 may include other components, such as interfaces to communicate over the network or with external storage or computing devices, display, input/output interfaces, operating systems, applications, data, and the like, which have not been described for brevity.

The processor 104 may be implemented as a dedicated processor, a shared processor, or a plurality of individual processors, some of which may be shared. The machine-readable storage medium 106 may be communicatively connected to the processor 104. In an example, the processor 104 may include a neural network accelerator. Among other capabilities, the processor 104 may fetch and execute computer-readable instructions, including instructions 108, stored in the machine-readable storage medium 106. The machine-readable storage medium 106 may include any non-transitory computer-readable medium including, for example, volatile memory such as RAM, or non-volatile memory such as EPROM, flash memory, and the like. The instructions 108 may be executed to implement processing of tensor operations onto the neural network accelerator.

The neural network accelerator includes hierarchical architecture across which various computational units of the neural network-based computing systems may be present. For example, the neural network accelerator may include memristive crossbar arrays which form a core. A collection of cores form a tile unit, with multiple such tile units forming a clump unit. Each of the cores and the tile units may further include respective memory units.

In an example, the processor 104 may fetch and execute instructions 108. For example, as a result of the execution of the instructions 110, a tensor, may be processed to provide a plurality of partitioned tensors. A tensor may be used to represent digital data in the form of an N-dimensional data structure. Continuing further, instructions 112 may be then executed to generate a working set corresponding to a set of partitioned tensors. The set of partitioned tensors are such that they are selected from the plurality of partitioned tensors. The working set which may be considered as a constituent portion of the tensor, forms the basis of implementing the tensor operations on the neural network accelerator.

With the working set defined, a tensor operation that is to be applied through the neural network accelerator may be determined. In an example, instructions 114 may be executed to identify a first operation which is to be performed on the working set. In an example, the neural network application may be further implemented as a series of operations, e.g., a first operation, a second operation and so forth, that are applied onto the working set. The present example is explained with respect to a first operation, which is a part of the tensor operation that is to be performed. However, such approaches may be performed for other number of operations without deviating from the scope of the present subject matter.

With the first operation identified, instructions 116 may be executed to define an input working space and an output working space corresponding to the first operation. In a similar manner, an input working space and output working space may be defined for other operations (say the second operation) which is to be performed on the working set. In an example, the input working space and the output working space for the first operation may be defined within a portion of a memory of a tile unit of the neural network accelerator. With the input working space and the output working space thus defined, the instructions 118 may be executed to copy over the working set to the input working space corresponding to the first operation.

The instructions 120 may then be executed to cause the first operation to execute on a core of the neural network accelerator. To such an end, the working set present in the first input working space may be retrieved and the first operation may thereby be applied onto the retrieved working set. Upon completion of the first operation, the first output working set generated as a result of the first operation being applied onto the working set is obtained. Thereafter, the instructions 122 may be executed to copy the generated first output working set into the output working space of the first operation. As mentioned previously, the output working space is provided in the tile unit memory, where the first output working set may be copied into. In an example, a subsequent operation may then retrieve the first output working set from the output working space of the first operation and copies to its own corresponding input working space, thereafter which the second operation may be applied. In this manner, subsequent other operations may be performed with the subsequent operations being able to retrieve the output working set of the preceding operations.

The above functionalities performed as a result of the execution of the instructions 108 may be performed by different programmable entities. In an example, such functionalities may be implemented through a compiler of the neural network-based computing systems. The compiler of the neural network-based computing system (referred to as a neural network compiler) may be called at runtime during the execution of programmable instructions implementing tensor operations. These and other examples are further described with respect to other figures.

Figure 2:
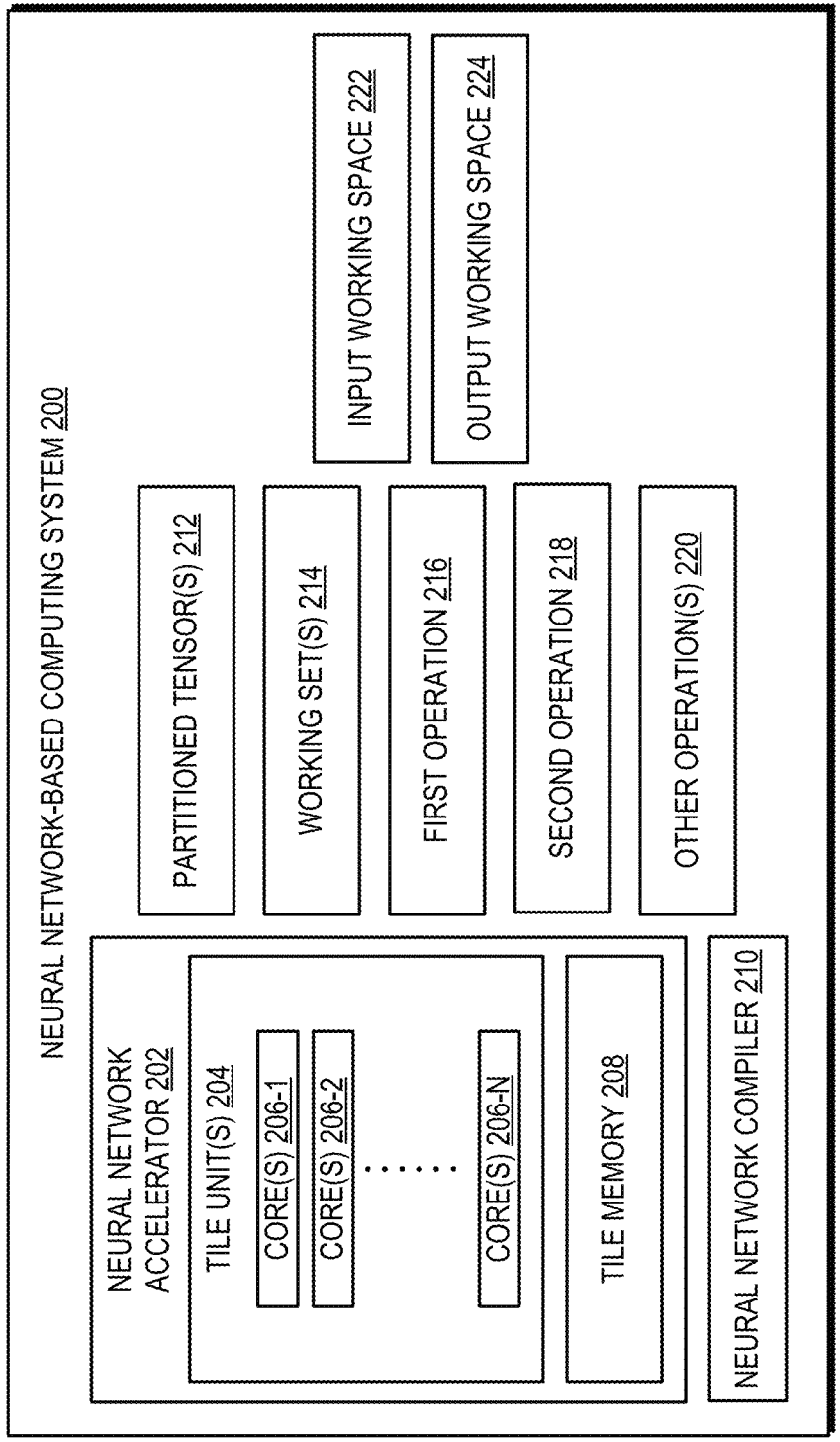
FIG. 2 illustrates a neural network-based computing system for performing tensor operations, as per another example.

FIG. 2 illustrates a neural network-based computing system 200 for performing tensor operations, in accordance with an example of the present subject matter. The neural network-based computing system 200 (referred to as system 200) may include a neural network accelerator 202 with a plurality of computational units arranged in a hierarchical manner. In an example, the system 200 may further include tile unit(s) 204 which include a plurality of core(s) 206-1, 2, ..., N. The core(s) 206-1, 2, ..., N (collectively referred to as cores 206) may further include a plurality of matrix-vector multiplication units for performing matrix vector multiplication. In an example, such matrix-vector multiplication units may be implemented using memristive crossbar arrays.

Continuing further, the tile unit(s) 204 may further include a tile memory 208. The tile memory 208 may be either a volatile memory (e.g., RAM), and/or non-volatile memory (e.g., EPROM, flash memory, Memristor, etc.). The tile memory 208 may alternately be coupled to an external memory unit, such as a flash drive, a compact disk drive, an external hard disk drive, or the like. It may be noted that although the present figure illustrates a single tile unit(s) 204, the system 200 may include a plurality of such similar tile unit(s) 204 without deviating from the scope of the present subject matter.

The system 200 may also include certain functional elements. In an example, the system 200 may include a neural network compiler 210 (referred to as compiler 210). The compiler 210 compiles, i.e., generates a machine-level executable code based on a programmable instruction provided for implementing tensor operations. Such programmable instructions may pertain to a neural network application expressed using a domain specific language (DSL), as per an example. In such instances, the DSL may be used for defining plurality of tensors, and various tensor operations that are to be implemented. In operation, the programmable instructions in DSL may be compiled by the compiler 210 at runtime. The compiler 210 may thereafter generate an executable or corresponding machine-level executable code. Once the machine-level code is generated, the same may be executed on the neural network accelerator 202. It may be noted that during compile time, the manner in which the various operations are to be performed are configured within the generated machine-level executable code. The machine-level executable code, when executed by a neural network accelerator 202, implements the various functionalities, as further described.

The system 200 may implement a variety of operations for processing digital data which is represented in the form of tensors. As explained previously, a tensor may be any N-dimensional data structure representing certain digital data. For example, a coloured image having certain pixels may be represented a 3-dimensional tensor with two dimensions representative of information corresponding to the longitudinally and vertically arranged pixel, with another dimension providing for channel (i.e., R, G, or B related information) corresponding to each pixel. It may be noted that higher dimensioned tensors which may pertain to image or any other forms of digital data are also possible. Such examples would also fall within the scope of the present subject matter.

A tensor which is representative of a digital data may be initially received as input by the system 200. At runtime, the received tensor may be processed by the compiler 210 to generate a plurality of partitioned tensor(s) 212. In an example, the partitioning of tensors may be performed across specific dimensions of the tensor under consideration. For example, the tensor representing 6*6 pixeled image and three channels, has dimensions corresponding to the 6-pixel rows, the 6-pixel columns and the 3 channels. In the context of the present example, the compiler 210 may partition the tensor along a channel boundary to provide 36 such partitioned tensor(s) 212, It may be noted that the partitioning of the tensor may be performed across any dimension to generate the partitioned tensor(s) 212.

Once the partitioned tensor(s) 212 are generated, the compiler 210 may process the same and provide a working set. In an example, the working set may be stored in the system 200 as working set(s) 214, The working set(s) 214 is set of partitioned tensor(s) 212 which are allocated storage in the tile memory 208. Continuing with the example discussed previously, the compiler 210 may process the 36 partitioned tensor(s) 212 to generate a working set(s) 214, In an example, the compiler 210 may generate a working set(s) 214 corresponding to, say a given row of the tensor. In such a case, an input tensor having 6*6*3 dimensions may be processed by the compiler 210 to provide 6 working sets having 6 partitioned tensor(s) 212, with each partitioned tensor(s) 212 having 3 elements. The way the dimension is selected about which the working set(s) 214 is generated may differ, without deviating from the scope of the present subject matter.

With the working set(s) 214 determined, the operations which are to be performed on the tensors may be determined. The compiler 210 may determine the various operations that are to be performed on the tensor received as an input, which are then configured to be performed, upon execution of the machine-level executable code. In an example, the various operations may pertain to a convolutional neural network (CNN). Examples of such processes include, but are not limited, convolution operation, pooling operation, and padding operation. For the purposes of the present description, the system 200 may include a first operation 216 and a second operation 218. The system 200 may further include other operation(s) 220. The approaches as described herein, are applicable for such operations without any limitation. The first operation 216, the second operation 218 and the other operation(s) 220 may be allocated to specific core(s) 206 within the tile unit(s) 204.

In an example, the entire tensor operation which is to be performed on an input tensor may be defined by way of a compute graph. A compute graph may be considered as a logical representation defining various nodes. Each of the nodes of the compute graph may represent an operation that is to be performed. The compute graph may further include edges representing the operand converging onto a node. The operation defined through node, is applied onto the operands to provide an output which may be represented as an outgoing edge emanating from the node.

In the context of the present example, the first operation 216 and the second operation 218 may be represented as nodes within a compute graph, wherein the operand(s) are the working set(s) 214. As will be explained further, the first operation 216 may receive an input working set from the working set(s) 214 and process the input to provide an output working set. The output working set of the first operation 216 may then be provided to the second operation 218 which then processes it as an input to provide the second output working set.

With the first operation 216 and the second operation 218 defined, the compiler 210 may further define an input working space 222 and an output working space 224 for the input working sets and the output working sets generated for each operation, such as the first operation 216, the second operation 218 or the other operation(s) 220. In an example, although not depicted in FIG. 2, a portion of the input working space 222 may correspond to the first operation 216, while another portion of the input working space 222 may correspond to the second operation 218. In a similar manner, certain portions of the output working space 224 may correspond to the first operation 216 and the second operation 218. In such a manner, different portions of the input working space 222 and the output working space 224, will correspond to all the operations that are to be performed. This aspect is further explained in greater detail in conjunction with FIG. 3. Returning to the present example, the input working space 222 and the output working space 224 are defined within the tile memory 208 of the tile unit(s) 204. In an example, the size of memory allocated to the input working space 222 and the output working space 224 may be dependent on a predefined number of working set(s) 214 which may be processed for the entire tensor operation to be completed. For the purposes of the present example, different portions of the input working space 222 and the output working space 224, may be utilized by the different respective operations.

The first operation 216 and the second operation 218 are such that they execute iteratively for different working set(s) 214 to provide an output. In an example, the first operation 216 and the second operation 218 may be linked such that the output of the first operation 216 serves as an input for the second operation 218. In a similar manner, the second operation 218 may also generate an output which may serve as an input for any one of the other operation(s) 220, The consecutive operations may be allocated to the different core(s) 206. In an example, the first operation 216 may be allocated to the core(s) 206-1, while the second operation 218 may be allocated to the core(s) 206-2, within the tile unit(s) 204. As per the present approaches, the consecution operations, e.g., the second operation 218, may wait for its corresponding working space within input working space 222 to be provided by the output from a prior operation, i.e., first operation 216. This ensure that such operations may continue without stalling.

With the input working space 222 and the output working space 224, the neural network accelerator 202 may execute of the neural network application. For example, the compiler 210 may cause the first operation 216 to be executed. As the first operation 216 executes, it may retrieve an input working set from the working set(s) 214. The first operation 216 may thereafter copy the input working set onto the input working space 222. Once copied, the first operation 216 may be applied onto the input working set to provide a first output working set. The first output working set generated by the first operation 216 may be copied to the output working space 224 defined within tile memory 208.

The first output working set generated by the first operation 216 may then be used as an input by the second operation 218. In an example, the second operation 218 may retrieve the first output working set and copy the same into the input working space 222. Thereafter, the second operation 218 may then be applied onto the first output working set (now available within the input working space 222). The second operation 218 then processes the input working set to generate the second output working set. The second output working set may then be copied to a second output working space in the output working space 224 within the tile memory 208.

In the manner as described above, the first operation 216 and the second operation 218 may be performed iteratively, with other working set(s) 214. For example, after the first output working set is generated by the first operation 216, the first operation 216 may loop back and request for a subsequent working set, e.g., from the working set(s) 214. Once a fresh working set is received, the first operation 216 may process the same to provide an output. It may be noted that the subsequent loop performed by the first operation 216 may be implemented in parallel with the execution of the second operation 218. The subsequent output working set may then be copied into the input working space 222 for the second operation 218. In such a manner, the first operation 216 and the second operation 218 may work in parallel with either of the operations processing their respective input working sets to provide an output to the next subsequent operation. Furthermore, the allocation of the first operation 216 and the second operation 218 to different cores also enables the first operation 216 and the second operation 218 to be performed independent from each other.

In an example, the compiler 210 implement synchronization of the first operation 216 and the second operation 218, at compile time, to ensure that the output working set are generated at a rate at which they are likely to be retrieved and processed by the second operation 218. In an example, the compiler 210 may associate a synchronization parameter with the first operation 216 at compile time, i.e., when the machine-executable code. The value of the synchronization parameter may be reset or set to a null value by default. During execution, the first operation 216 generates and copies the first output working set to the output working space 224. Thereafter, in conformance with the value of the synchronization parameter which is set, the second operation 218 may retrieve the first output working set from the output working space 224 for processing.

As described previously, the input working space 222 and the output working space 224 are defined within the tile memory 208 of the tile unit(s) 204. For example, it may be possible that the output working space 224 for certain operations may be defined in the tile memory of a first tile unit, while the input working space 222 for a certain other operation may be defined in the tile memory of a second tile unit. In such a case, the other operation may seek to retrieve an output working set from output working space 224 defined in a tile memory which may be remote to the tile memory in which an input working space 222 to be used by the other operation. In an example, output working sets, present in a tile memory 208 of another tile unit(s) 204, may be retrieved in response to specific Request-For-Data (RFD) messages defined and inserted by the compiler 210 at compile time. As a result, at runtime the working sets may be transmitted between different tile unit(s) 204 only pursuant to request from the corresponding tile unit(s) 204.

Figure 3:
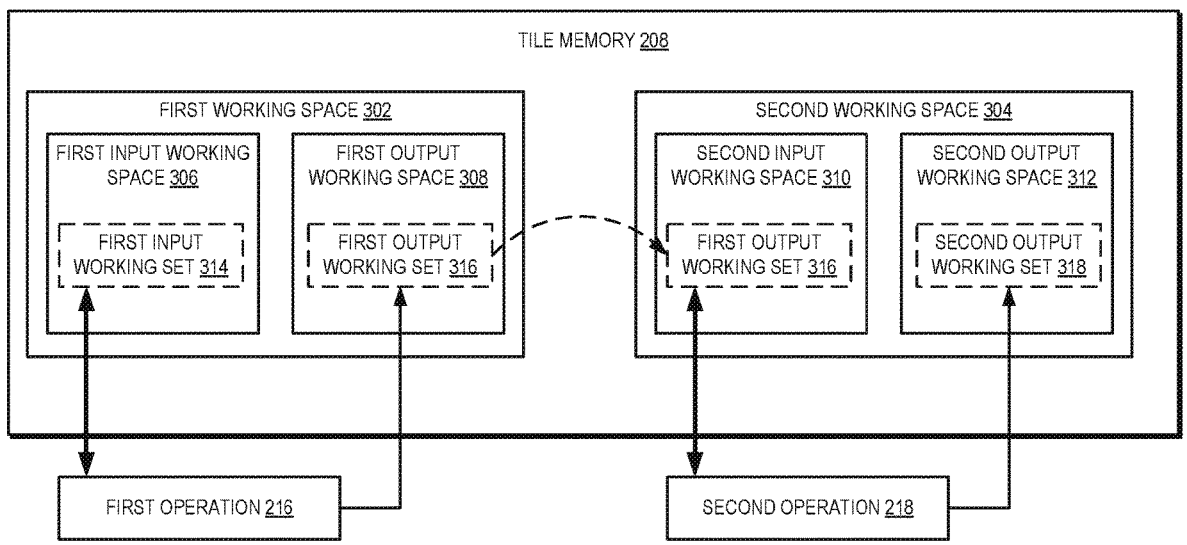
FIG. 3 illustrates a block diagram depicting interaction of various elements of a tile memory of a neural network-based computing system, as per an example.

As described, the compiler 210 enable partitioning the tensors to provide partitioned tensor(s) 212 which may then be processed by different operations, such as the first operation 216 and the second operation 218, to implement the entire tensor operation. These aspects are illustrated in detail in conjunction with FIG. 3. FIG. 3 depicts working spaces (e.g., input working space 222 and output working space 224) within a tile memory 208. The input and output working spaces may be defined for all operations or may be designated for the respective operations. For the purposes of illustration, a certain portion of the memory of the tile unit(s) 204 may be allocated for the first operation 216, with the portion of the memory being referred to as first working space 302. In a similar manner, the compiler 210 may allocate another portion of the tile memory 208 (referred to as the second working space 304) for the second operation 218.

The first working space 302 may further include a first input working space 306 and a first output working space 308. The second working space 304, in a similar manner, may include a corresponding second input working space 310 and a second output working space 312. The first input working space 306 (corresponding to the first operation 216) and the second input working space 310 (corresponding to the second operation 218) may be logical portions of the input working space 222. Similarly, the first output working space 308 (corresponding to the first operation 216) and the second output working space 312 (corresponding to the second operation 218) may be logical portions within the output working space 224.

At runtime, an input working set 314 may be initially provided into the first input working space 306 within the first working space 302, The input working set 314 may include a set of partitioned tensors, such as the partitioned tensor(s) 212, and is copied to the first input working space 306. Once the first input working set 314 is available in the first input working space 306, the first operation 216 may be performed. The first operation 216 is performed on the first input working set 314 to generate a first output working set 316, The generated first output working set 316 may then be copied to the first output working space 308 within the tile memory 208.

With the first output working set 316 available, the second operation 218 may then be initiated. On being initiated, the second operation 218 may retrieve the first output working set 316 from the first output working space 308 and copy the same to the second input working space 310 within the second working space 304. Now available within the second input working space 310, the second operation 218 may be performed onto the first output working set 316. The second operation 218, on being performed on the first output working set 316, generates a second output working set 318. The second output working set 318 is copied to the second output working space 312. In a similar manner, the second output working set 318 may then be retrieved by another subsequent operation. It may be noted that unless the output working set, e.g., the second output working set 318 is retrieved by a subsequent operation, the second operation 218 may be put on hold. Only when the second output working set 318 is retrieved, may the second operation 218 commence to generate another output working set, which will be copied to the second output working space 312. In an example, the first operation 216, the second operation 218 and all subsequent operations (e.g., the other operation(s) 220), may be linked with the output working set of one operation forming an input working set of the next.

Figure 4:
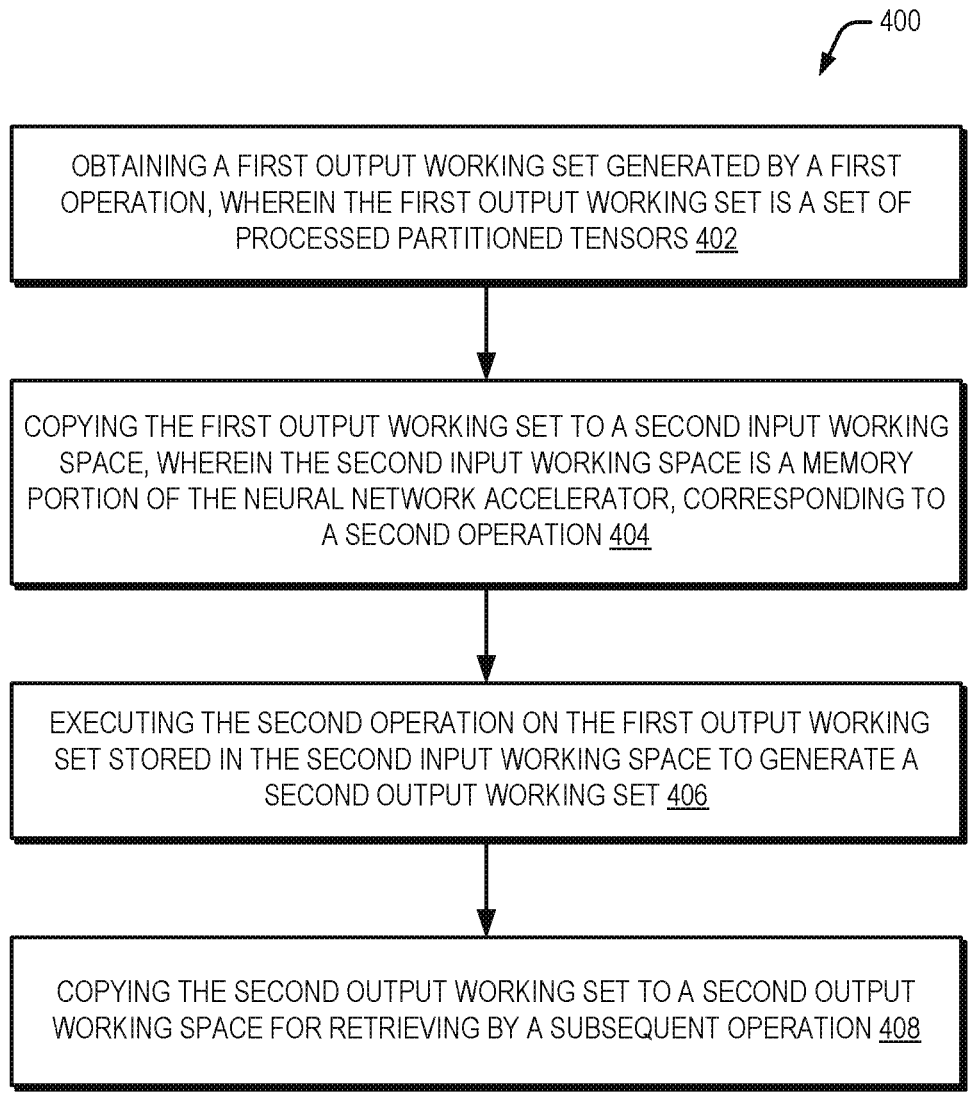
FIG. 4 illustrates a method for performing tensor operations, as per an example.
Figure 5:
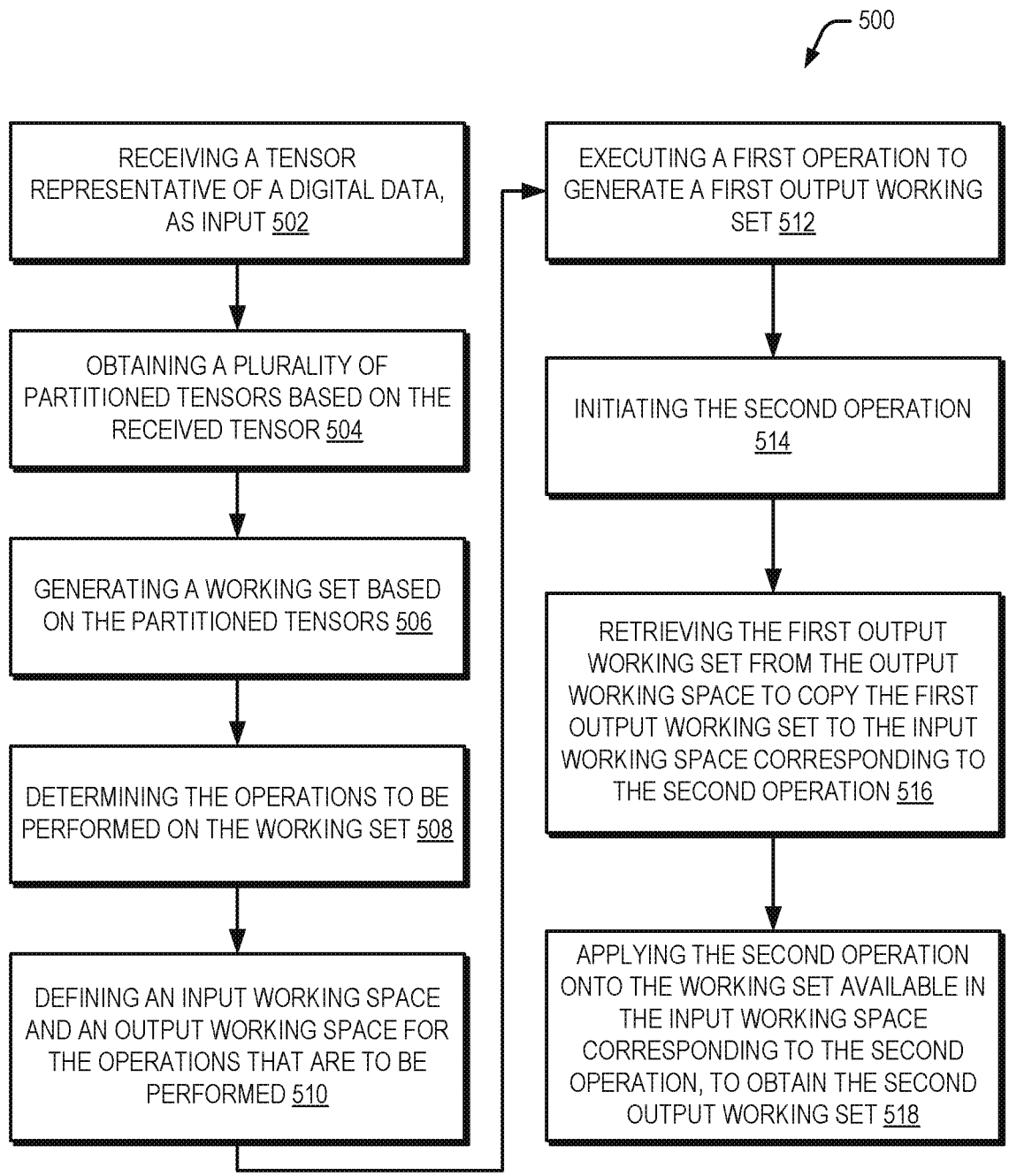
FIG. 5 illustrates a method for performing tensor operations, as per another example.

FIGS. 4-5 illustrate example methods 400-500 for performing tensor operation by a neural network accelerator implemented in a neural network-based computing system, in accordance with examples of the present subject matter. The order in which the above-mentioned methods are described is not intended to be construed as a limitation, and some of the described method blocks may be combined in a different order to implement the methods, or alternative methods.

Furthermore, the above-mentioned methods may be implemented in any suitable hardware, computer-readable instructions, or combination thereof. The steps of such methods may be performed by either a system under the instruction of machine executable instructions stored on a non-transitory computer readable medium or by dedicated hardware circuits, microcontrollers, or logic circuits. For example, the methods may be performed by the one of systems 102 or 200. In an implementation, the methods may be performed under an "as a service" delivery model, where the system 102, 200, operated by a provider, receives programmable code in domain specific language for performing one or more tensor operations, using a neural network accelerator, such as the neural network accelerator 202. Herein, some examples are also intended to cover non-transitory computer readable medium, for example, digital data storage media, which are computer readable and encode computer-executable instructions, where said instructions perform some or all the steps of the above-mentioned methods.

In an example, the method 400 may be implemented by system 102 for performing tensor operations on a set of partitioned tensors (e.g., partitioned tensor(s) 212) referred to as working sets. At block 402, a first output working set generated by a first operation is obtained. The first output working set may be considered as a set of partitioned tensors. For example, the neural network accelerator 202 may perform first operation 216 onto an input working set which may be available in input working space 222. Based on the first operation 216, a first output working set may be generated. In an example, the first output working set thus generated may be copied to output working space 224 (which corresponds to or is related to the first operation 216).

At block 404, the first output working set is copied to a second input working space. The second input working space, corresponding to a second operation, is a portion of memory of a neural network accelerator. For example, once the first output working set is generated by the first operation 216, a second operation 218 may be initiated. The second operation 218 may then retrieve the first output working set in the output working space 224 and copies it into the input working space 222.

At block 406, the second operation may be executed on the first output working set stored in the second input working space. As a result of the second operation being applied onto the first output working set, a second output working set is generated. For example, the second operation 218 is performed on the first output working set stored in the input working space 222. In an example, the second operation 218 may be linked to the first operation 216. In another example, the first operation 216 and the second operation 218 may pertain to a convolutional neural network (CNN). Examples of such processes include, but are not limited, convolution operation, pooling operation, and padding operation.

At block 408, the second output working set is copied to a second output working space. From the second output working space, the second output working set may be retrieved by a subsequent operation. For example, the second output working set generated by the second operation 218 is copied to its corresponding output working space 224. In such a case, the second output working set is to then serve as an input for a subsequent operation. The subsequent operation may be any one operation from amongst the operation(s) 220.

FIG. 5 illustrates another example method 500 for performing tensor operations by a neural network-based computing system. In an example, the neural network-based computing system may further include a neural network accelerator. The neural network accelerator may further be implemented using a memristive crossbar array, At block 502, a tensor representative of a digital data may be initially received as input. For example, the neural network-based computing system 200 may obtain a tensor onto which a tensor operation is to be performed. In an example, the tensor may be for a digital image, a video, or an audio file. The processing of the tensor may be performed through a series of operations, such operations may be implemented through programmable code prepared in a domain specific language (DSL). The programmable code when executed may invoke a compiler 210 which generates a binary file which is eventually loaded executed onto the neural network accelerator 202.

At block 504, a plurality of partitioned tensors may be obtained based on the received tensor. For example, at runtime, the compiler 210 may process the received tensor to generate a plurality of partitioned tensor(s) 212. In an example, the partitioning of tensors may be performed across certain dimensions of the tensor. In one example, a tensor representing a 6*6 pixeled image and three channels, when partitioned a channel boundary will provide thirty-six such partitioned tensor(s) 212 each with three elements corresponding to the channel.

At block 506, a working set based on the partitioned tensors, is generated. For example, the compiler 210 may select a set of partitioned tensors, from amongst the partitioned tensor(s) 212, to provide a working set. In an example, the working set may be stored in the system 200 as working set(s) 214. The concept of the working set(s) 214 is explained in the context of the example discussed previously. In the example above, the compiler 210 may process the 36 partitioned tensor(s) 212 to generate a working set(s) 214 corresponding to, say a given row of the tensor. This will provide six working sets having six partitioned tensor(s) 212, with each partitioned tensor(s) 212 having 3 elements. The way the dimension is selected may differ, without deviating from the scope of the present subject matter.

At block 508, the operations to be performed on the working set are determined. For example, the compiler 210 may define a first operation 216 and a second operation 218 that are to be performed on the working set(s) 214 generated based on the partitioned tensor(s) 212. In an example, the first operation 216 and the second operation 218 may be linked to each other such that the output of one of the operations is to serve as an input for the other operation. In another example, the first operation 216 and it may be allocated to specific core 206 within the neural network accelerator 202.

At block 510, an input working space and an output working space are defined for the operations that are to be performed. For example, the compiler 210 may further define an input working space 222 and an output working space 224. The input working space 222 and the output working space 224 serves as a memory location for the input working sets that are utilized as input, and the output working sets that are generated as output, by the different operations. In an example, the input working space 222 and the output working space 224 are defined within the tile memory 208 of the tile unit(s) 204. The size of memory allocated to the input working space 222 and the output working space 224 may be dependent on a predefined number of working set(s) 214 which may be processed for the entire tensor operation to be completed. In an example, the input working space 222 may further include the first input working space 306 (corresponding to the first operation 216) and the second input working space 310 (corresponding to the second operation 218).

At block 512, the first operation may be executed. For example, the first operation 216 is executed by the neural network accelerator 202. Upon execution, the first operation 216 may retrieve an input working set (e.g., the first input working set 314). The first operation 216 may, thereafter, copy the input working set onto a portion of the input working space 222 corresponding to the first operation 216 (e.g., first input working space 306). Once copied, the first operation 216 may be applied onto the input working set to provide a first output working set (e.g., first output working set 316), In an example, the first output working set may be copied to the output working space 224 corresponding to the first operation 216 (e.g., first output working space 308), within tile memory 208. At block 514, the second operation may be initiated. For example, the compiler 210 may cause to execute the second operation 218.

At block 516, the first output working set is retrieved from the output working space corresponding to the first operation and copied to the input working space corresponding to the second operation. For example, the second operation 218 may retrieve the first output working set from the output working space 224 and copy the same into a portion of the input working space 222 (e.g., second input working space 310) corresponding to the second operation 218.

At block 518, the second operation may be applied onto the working set available in the input working space corresponding to the second operation. For example, the second operation 218 may be applied onto the first output working set (now available as an input in the second input working space 310), The second operation 218 then processes the working set to generate the second output working set 318. The second output working set 318 may then be copied to a portion of the output working space 224 (e.g., second output working space 312) corresponding to the second operation 218, within the tile memory 208. In an example, the first operation 216 and the second operation 218 may be synchronized to ensure that the output working set are generated at a rate at which they are likely to be retrieved and processed by the second operation 218 based on a synchronization parameter. In such instances, the second operation 218 may retrieve the first output working set on determining the synchronization parameter to be set.

Figure 6:
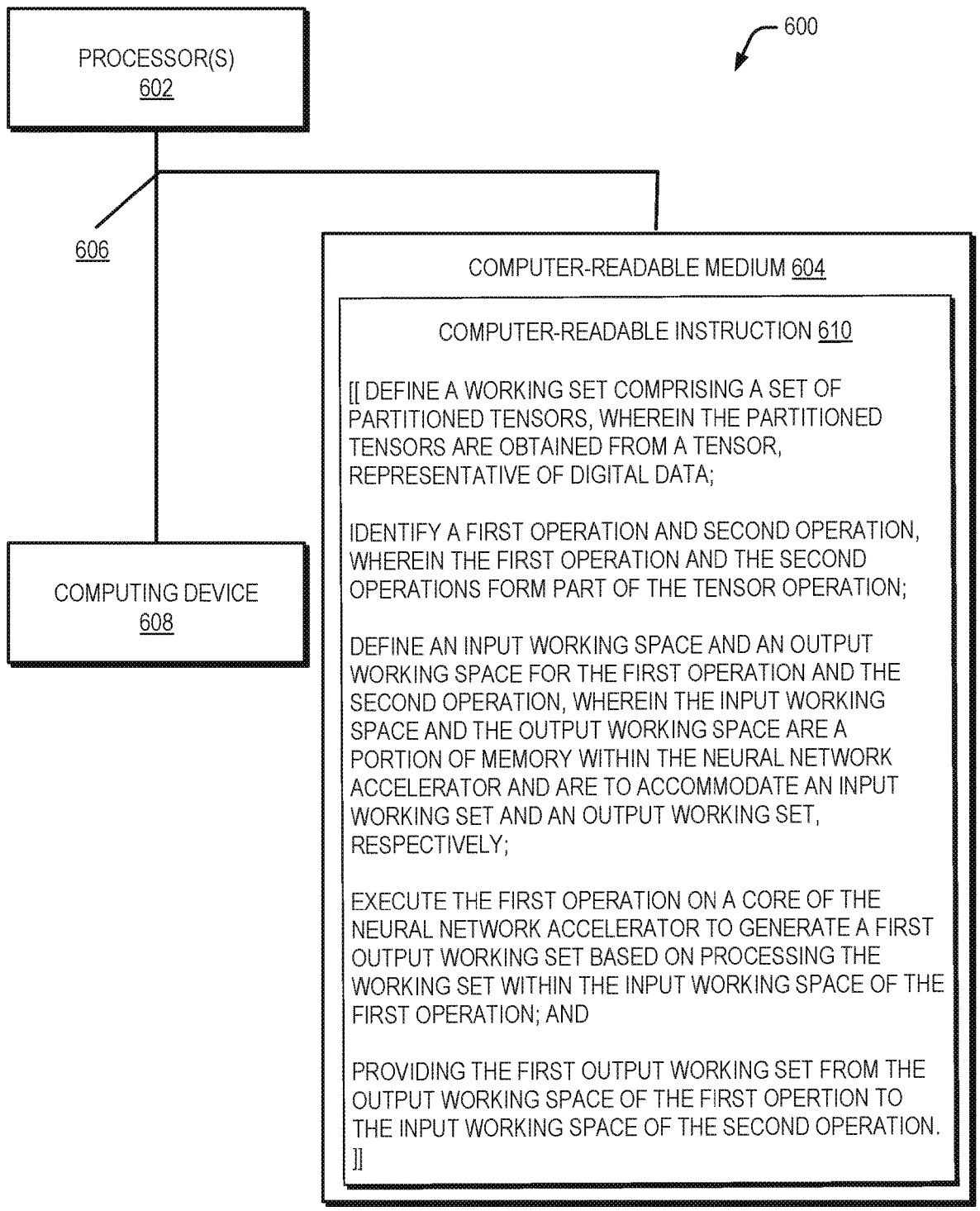
FIG. 6 illustrates a system environment implementing a non-transitory computer readable medium for performing tensor operations, as per an example.

FIG. 6 illustrates a computing environment 600 implementing a non-transitory computer readable medium for performing tensor operations by a neural network-based computing system, such as the system 200. The neural network-based computing system may further include a neural network accelerator, such as the neural network accelerator 202, onto which tensor operations are executed. In an example, the computing environment 600 includes processor(s) 602 communicatively coupled to a non-transitory computer readable medium 604 through a communication link 606. In an example implementation, the computing environment 600 may be for example, the system 200. In an example, the processor(s) 602 may have one or more processing resources for fetching and executing computer-readable instructions from the non-transitory computer readable medium 604. The processing resource may be neural network accelerator, such as a neural network accelerator 202. The processor(s) 602 and the non-transitory computer readable medium 604 may be implemented, for example, in system 200 (as has been described in conjunction with the preceding figures).

The non-transitory computer readable medium 604 may be, for example, an internal memory device or an external memory device. In an example implementation, the communication link 606 may be a network communication link. The processor(s) 602 and the non-transitory computer readable medium 604 may also be communicatively coupled to a computing device 608 over the network.

In an example implementation, the non-transitory computer readable medium 604 includes a set of computer readable instructions 610 which may be accessed by the processor(s) 602 through the communication link 606. Referring to FIG. 6, in an example, the non-transitory computer readable medium 604 includes instructions 610 that cause the processor(s) 602 to define a working set comprising a set of partitioned tensors. The partitioned tensors, such as partitioned tensor(s) 212, may in turn be obtained partitioning an input tensor. In an example, the working sets may be stored in the system 200 as working set(s) 214.

Once the working set, such as working set(s) 214, is obtained, the instructions 610 may cause a processor(s) 602 to identify a first operation, such as the first operation 216, and a second operation, such as second operation 218, which is to be performed on the working set. Thereafter, the instructions 610 may further cause to define an input working space and an output working space corresponding to the first operation and the second operation. The input working space, such as the input working space 222, and the output working space, such as the output working space 224, are a portion of a memory of a tile unit. The tile unit is one of a computational unit of the neural network accelerator 202. In an example, the tile unit may perform a number of pre-defined instructions.

The instructions 610 may be further executed to cause the first operation 216 to be performed on the working set(s) 214 which may be present in a portion of input working space 222 corresponding to the first operation 216. The execution of the first operation 216 result in a first output working set (e.g., first output working set 316) which may then be stored in the output working space 224. The instructions 610 may further cause the retrieving and providing the first output working set 316 from the output working space 224 into a portion of the input working space 222 which corresponds to the second operation 218. In an example, subsequently, the second operation 218 may be performed on the first output working set 316 to provide a second output working set 318. In this manner, output of a certain operation may be provided as an input to a subsequent operation.

Although examples for the present disclosure have been described in language specific to structural features and/or methods, it is to be understood that the appended claims are not necessarily limited to the specific features or methods described. Rather, the specific features and methods are disclosed and explained as examples of the present disclosure.

We claim:

1. A system comprising:
a processor;
a machine-readable storage medium comprising instructions executable by the processor to:
generate a plurality of partitioned tensors based on a received tensor, wherein the received tensor is representative of digital data;
generate a working set corresponding to a set of partitioned tensors from amongst the plurality of partitioned tensors;
identify a first operation to be performed on the working set;
define an input working space and an output working space corresponding to the first operation, the input working space and the output working space are to be defined in a portion of a memory of a neural network accelerator;
copy the working set to the input working space corresponding to the first operation;
execute the first operation on the working set in the input working space to generate a first output working set; and
copy the first output working set to the output working space of the first operation.

2. The system as claimed in claim 1, wherein the instructions executable by the processor are further to:

define a second input working space and a second output working space corresponding to a second operation;

retrieve the first output working set from the output working space of the first operation;

copy the first output working set to the second input working space;

execute the second operation onto the first output working set stored in the second input working space to generate second output working set; and write the second output working set to the second output working space.

3. The system as claim in claim 2, wherein the instructions executable by the processor are further to:

set a value of a synchronization parameter associated with the first operation in response to the copying the first output working set to the output working space of the first operation; and based on a determination that the value of the synchronization parameter is set, cause the second operation to retrieve the first output working set from the output working space.

4. The system as claimed in claim 1, wherein the instructions executable by the processor are further to generate a computation graph comprising nodes, wherein one of the nodes represents the first operation and another node represents the second operation.

5. The system as claimed in claim 1, wherein the input working space and the output working space are each defined within a memory of a tile unit of the neural network-accelerator.

6. The system as claimed in claim 2, wherein the first operation is allocated to a first core and the second operation is allocated to a second core, the first core and the second core being selected from amongst a plurality of cores within the neural network accelerator.

7. The system as claimed in claim 1, wherein the neural network accelerator further comprising a vector-vector addition unit, a scalar-scalar addition unit, and a matrix-matrix addition unit.

8. The system as claimed in claim 1, wherein the first operation is to iteratively process another received input working sets to generate subsequent output working sets.

9. The system as claimed in claim 1, wherein size of the input working space and the output working space corresponding to the first operation is based on the size of the working set.

10. A method for processing a tensor by a neural network accelerator, the method comprising:

obtaining a first output working set generated by a first operation, wherein the first output working set is a set of processed partitioned tensors;

copying the first output working set to a second input working space, wherein the second input working space is a memory portion of the neural network accelerator, corresponding to a second operation;

executing the second operation on the first output working set stored in the second input working space to generate a second output working set; and copying the second output working set to a second output working space for retrieving by a subsequent operation.

11. The method as claimed in claim 10, wherein the working set is defined within a memory of a tile unit of the neural network accelerator, the neural network accelerator comprising a plurality of core units having a memristor-crossbar array.

12. The method as claimed in claim 10, wherein the first operation and the second operation are allocated to a first core unit and a second core unit, respectively, wherein the first core unit and the second core unit are within a tile unit of a memristor crossbar array-based processing unit.

13. The method as claimed in claim 10, further comprising generating a computation graph comprising nodes, wherein one of the nodes represents the first operation and another node represents the second operation.

14. The method as claimed in claim 10, wherein the obtaining further comprises:

determining a value of a synchronization parameter associated with the first operation; and on determining that the value of the synchronization parameter has been set, causing to obtain the first output working set generated by the first operation.

15. The method as claimed in claim 10, wherein the first operation and the second operation are matrix-vector multiplication operations.

16. The method as claimed in claim 10, wherein for the set of processed partitioned tensors corresponding to a tensor representative of an image having pixel rows, pixel columns and a number of channel, the size of the second input working space and the second output working space is based on the number of pixel columns and the number of channels.

17. A non-transitory computer-readable medium comprising instructions for performing a tensor operation using a neural network accelerator, the instructions being executable by a processing resource to:

define a working set comprising a set of partitioned tensors, wherein the partitioned tensors are obtained from a tensor, the tensor being representative of digital data;

identify a first operation and second operation, wherein the first operation and the second operations form part of the tensor operation;

define an input working space and an output working space for the first operation and the second operation; wherein the input working space and the output working space are a portion of memory within the neural network accelerator, and is to accommodate an input working set and an output working set, respectively;

execute the first operation on a core of the neural network accelerator to generate a first output working set based on processing the working set within the input working space of the first operation; and providing the first output working set from the output working space of the first operation to the input working space of the second operation.

18. The non-transitory computer-readable medium as claimed in claim 17, wherein on executing the first operation, the instructions are to further:

copy the generated first output working set to the output working space corresponding to the first operation;

cause to retrieve the first output working set from the output working space corresponding to the first operation to copy to the input working space of the second operation; and execute the second operation on the first output working set to generate the second output working set.

19. The non-transitory computer-readable medium as claimed in claim 17, wherein the first operation and the second operation are to execute on a first core and a second core, respectively, of the neural network accelerator.

20. The non-transitory computer-readable medium as claimed in claim 17, wherein first operation iteratively fetches another input working set to copy within the input working space, after providing an output working set to the input working space of the second operation.

\* \* \* \* \*